United States Patent
Kang et al.

(10) Patent No.: US 7,371,675 B2
(45) Date of Patent: May 13, 2008

(54) METHOD AND APPARATUS FOR BONDING A WIRE

(75) Inventors: In-Ku Kang, Cheonan-si (KR); Sang-Ho An, Suwon-si (KR); Sun-Mo Yang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/968,915

(22) Filed: Oct. 21, 2004

(65) Prior Publication Data

US 2005/0200009 A1    Sep. 15, 2005

(30) Foreign Application Priority Data

Mar. 11, 2004    (KR) .................. 10-2004-0016414

(51) Int. Cl.
*H01L 21/44*    (2006.01)

(52) U.S. Cl. .................. 438/617; 438/612; 438/613; 257/E23.033

(58) Field of Classification Search ................ 438/617; 257/784

See application file for complete search history.

(56) References Cited

U.S. PATENT DOCUMENTS

| 2002/0158325 | A1 | 10/2002 | Yano et al. | |
| 2003/0042621 | A1 * | 3/2003 | Chen et al. | .................. 257/784 |
| 2004/0115918 | A1 * | 6/2004 | Kanda et al. | ................ 438/612 |
| 2004/0171191 | A1 * | 9/2004 | Connell et al. | ............. 438/112 |

FOREIGN PATENT DOCUMENTS

| JP | 07-074199 | * | 3/1995 |
| JP | 2001-284388 | | 10/2001 |
| KR | 2003-0075860 | | 9/2003 |

* cited by examiner

*Primary Examiner*—Thanh Nguyen
(74) *Attorney, Agent, or Firm*—Harness, Dickey & Pierce, P.L.C.

(57) ABSTRACT

A method and apparatus for bonding a wire and a wire bond device formed by the same are disclosed. The method includes providing a carrier with at least a first pad, providing a semiconductor chip having at least the second pad, the at least second pad being smaller than the first a pad, forming a conductive stud bump on the second pad, and forming a bonding wire that has two terminal portions, which are respectively bonded to the first pad and the stud bump to electrically connect the first pad and the second pad. The stud bump is bonded to the second pad by a ball bonding method which uses a wire that has an approximately smaller diameter than the bonding wire. Further, a prominence formed on one end of the terminal portions is provided which has an approximately larger diameter than the stud bump.

22 Claims, 6 Drawing Sheets

METHOD AND APPARATUS FOR BONDING A WIRE

This U.S. non-provisional application claims priority under 35 U.S.C. § 119 to Korean Patent Application No. 2004-16414, filed on Mar. 11, 2004, in the Korean Intellectual Property Office, the contents of which are incorporated by reference herein in their entirety.

BACKGROUND OF THE INVENTION

1. Field of the Invention

The present invention relates generally to wire bonding of semiconductor devices, and more particularly, to a method of bonding a wire and a wire bond structure formed by the same.

2. Description of the Related Art

In recent years, as portable electronic devices have been scaled down (e.g., smaller, thinner and lightweight) where semiconductor devices are used. As such, the process for packaging semiconductor devices has also been scaled down. In these semiconductor devices, a conventional packaging process may include only one semiconductor chip, a multi-chip package (MCP) in which a plurality of semiconductor devices are arranged or stacked has been developed and widely used. An MCP may be used, for example, in electronic devices and telecommunication devices.

In an MCP, the arranged or stacked semiconductor chips may perform different functions for various operations. Alternatively, the arranged or stacked semiconductor chips may perform the same function to increase the charge potential thereof. Because the MCP includes at least two or more arranged or stacked chips, there many be restrictionin manufacturing the semiconductor devices.

For example, one problem associated with an MCP may be the diameters of wires used for wire bonding. That is, as the length of a wire increases, the diameter of the wire should also increase so as to prevent the bending or sweeping of the wire. Thus, because an MCP includes various chips that are different in size mounted therein, a smaller semiconductor chip may have a longer wire bonding than a larger semiconductor chip. In this case, the longer wire may undesirably bend which may come into contact with an adjacent wire of another chip.

Further, another problem associated with an MCP may be that a wire may be swept (e.g., wire being out of position or even losing contact to the chip pads due to the flow of epoxy molding compound (EMC) caused by an injection of the EMC during the molding process of the packaging processes).

Accordingly, as semiconductor devices become more highly integrated, chip pads required for wire bonding of the semiconductor devices may be scaled down. For this reason, wires that are large in diameter may not be used.

FIGS. 1 through 4 are cross-sectional views illustrating a conventional process of bonding a wire to a chip pad.

Referring to FIG. 1, a conventional wire bonding of semiconductor chips may generally utilize a ball bonding process. For example, as shown in FIG. 1, a ball-shaped prominence 15 may be formed at a terminal portion of a wire 10 which may have a diameter of D1 by using a capillary of a wire bonding machine. As shown in FIG. 2, the prominence 15 may be attached to a conductive pad 20 which has a width of D4.

During the attaching process, the prominence 15 is pressed against the conductive pad 20, which may deform into a prominence 15' The prominence may then be bonded to the conductive pad 20. Thereafter, as the capillary moves and continues to provide a conductive material, the wire 10 may extend from the prominence 15'. The extended wire 10 may be bonded by a stitch bonding method to another pad, for example, an electrode pad that may be disposed on a carrier on which a semiconductor chip may be mounted.

However, to form a bond in a ball bonding manner, (i.e., when the ball-shaped prominence 15' is bonded to the pad 20), the width D3 of the prominence 15' should not be greater than the width D4 of the pad 20. In other words, the width D4 of the pad 20 should be greater than the width D3 of the prominence 15' which may be bonded to the pad 20.

The width D3 of the bonded prominence 15' may depend on the width D2 of the initial ball-shaped prominence 15 of FIG. 1. The width D2 of the ball-shaped prominence 15 depends on the diameter D1 of the wire 10 that is provided to the capillary, which may be formed of, for example, gold. As a consequence, the diameter D1 of the wire 10 depend on the width D4 of the pad 20. That is, the width D4 of the pad 20 may place a limit on the diameter D1 of a usable wire 10.

Accordingly, as shown in FIG. 3, if a conductive pad 21 formed on a semiconductor chip 30 is scaled down, the diameter D11 of wire 11, which may be bonded to the pad 21, may be limited by the width D41 of the pad 21 since the width D31 of a bonded prominence 16 may be limited by the width D41 of the pad 21. That is, only a wire 11 of a smaller diameter than the value D11 may be used in the wire bonding process. However, if the bonding wire 11 becomes longer, then wire 11 may be undesirably bent or swept.

For example, referring to FIG. 4 which illustrates an MCP, a first semiconductor chip 31 may be mounted on a carrier 40 during a packaging process of semiconductor devices, and a second semiconductor chip 35 may be mounted on the first semiconductor chip 31. With the higher integration of semiconductor devices and reduction of design rules, a small pitch first pad 21 and a small pitch second pad 25 may be mounted in the first and second semiconductor chips 31, 35, respectively. In order to electrically connect the first and second pads 21, 25 to a first electrode pad 51 and a second electrode pad 55, respectively, a first wire 13 and a second wire 17, respectively, may be mounted using a wire bonding process. The first and second electrode pads 51, 55 may be formed on the carrier 40.

Here, the diameters of the first and second wires 13, 17 are limited by the sizes of the first and second pads 21, 25, respectively. As a result, this may require the first and second wires 13, 17 to berelatively small. Further, the second wire 17, which may have a longer length L2 than the length L1 of the first wire 13, may bend due to the lack of tension in the second wire 17 or the second wire 17 may be swept by the flow of epoxy molding compound (EMC) caused by an injection of the EMC during the molding process. Additionally, even the first wire 13 having the relatively smaller length L1 may be bent or swept because the first pad 21 and second pad 25 are very thin.

However, even if wires 13, 17 may be bent or swept, the wires 13, 17 maynot be provided with a sufficient diameter because the prominence 16 that depends on the fine sizes of the first and second pads 21, 25 may provide a limited size.

SUMMARY OF THE INVENTION

In Accordance to an exemplary embodiment, a method of bonding a wire to a small pitch pump using reverse bonding is disclosed, which can prevent the occurrence of being or sweeping of a bonding wire. In exemplary method, eve if the size of the conductive pad for a semiconductor chip is small, a wire of sufficient diameter may be used without being limited by the size of the conductive pad.

According to at least one exemplary embodiment of the present invention, there is provided a method of wire bonding including providing a carrier having at least a first pad, providing a semiconductor chip having at least a second pad, the second being smaller than the first pad, forming a conductive stud bump on the second pad and forming a bonding wire that has two terminal portions which are respectively bonded to the first pad and the stud bump to electrically connect the first pad and the second pad, wherein one end of the terminal portion may include a prominence formed by ball bonding and the prominence may have an approximately larger diameter than the stud bump.

According to other exemplary embodiments of the present invention, the method may further include the other end of the terminal portions may be electrically connected to the second pad by extending from the prominence onto the stud bump.

According to other exemplary embodiments of the present invention, the bonding wire may be bonded to the stud bump by stitch bonding.

According to other exemplary embodiments of the present invention, the stud bump may be bonded to the second pad by ball bonding using a wire that has an approximately smaller diameter than the bonding wire.

According to other exemplary embodiments of the present invention, the wire that has the approximately smaller diameter than the bonding wire may have a diameter that allows the stud bump to be approximately within the size range of the second pad.

According to other exemplary embodiments of the present invention, the second pad may have a size of approximately 70 µm or less, the wire that has the approximately smaller diameter than the bonding wire may have a diameter of approximately 25.4 µm or less, and the bonding wire that is electrically connected to the first pad may have a diameter of approximately 30 µm or more.

According to another exemplary embodiment of the present invention, there is provided a method of wire bonding including providing a carrier having at least a first pad, providing a wafer, separating the wafer into individual semiconductor chips, each of the semiconductor chips having, bonding the semiconductor chips to the carrier, forming a conductive stud bump on the second pad of each of the semiconductor chips, and forming a bonding wire, one end electrically connected to the first pad by a prominence and the other end electrically connected to the second pad by extending from the prominence to the stud bump, the bonding wire being bonded to the stud bump by stitch bonding, wherein the prominence may be bonded to the first pad by ball bonding and can have an approximately larger diameter than the stud.

According to other exemplary embodiments of the present invention, the forming of the stud bump and the forming of the bonding wire connected to the first pad may be performed at least one of an identical wire bonding machine by alternately providing wires having different diameters to a capillary and by different wire bonding machines.

According to another exemplary embodiment of the present invention, there is provided a method of wire bonding including providing a carrier having at least a first pad, providing a wafer having at least a second pad, the second pad having approximately a smaller size than the first pad, separating the wafer into individual semiconductor chips, attaching the semiconductor chips to the carrier, forming a conductive stud bump on the second pad, and forming a bonding wire, one end electrically connected to the first pad by a prominence and the other end electrically connected to the second pad by extending from the prominence to the stud bump, the bonding wire may be bonded by the stud bump by stitch bonding, wherein the prominence may be bonded to the first pad by ball bonding and may have an approximately larger diameter than the stud bump.

According to anotherexemplary embodiment of the present invention, there is provided a method of wire bonding including providing a carrier having at least a first pad, providing a first semiconductor chip including at least a second pad, placing a second semiconductor chip including a third pad that has approximately a smaller size than the first pad, forming a conductive first stud bump on the third pad, forming a first bonding wire that electrically connects the second pad and the first pad, and forming a second bonding wire, one end electrically connected to the first pad by a prominence and the other end electrically connected to the third pad by extending from the prominence onto the first stud bump, wherein the second bonding wire may be bonded to the first pad by ball bonding and may have an approximately larger diameter than the first stud bump, and the second bonding wire may have an approximately larger length than the first bonding wire.

According to other exemplary embodiments of the present invention, before forming the first bonding wire, the wire bonding method may further include forming a conductive second stud bump on the second pad, the second stud bump having approximately the same size as the first stud bump on the second pad.

According to other exemplary embodiments of the present invention, the first bonding wire may be electrically connected to the first pad by the prominence at one end, and electrically connected to the second dpad by extending from the prominence to the second stud bump at the other end.

According to other exemplary embodiments of the present invention, the prominence may be bonded to the first pad by ball bonding.

According to other exemplary embodiments of the present invention, the first bonding wire may be bonded to the second stud bump by stitch bonding.

According to other exemplary embodiments of the present invention, the first bonding wire may have approximately the same diameter as the second bonding wire.

According to other exemplary embodiments of the present invention, the wire bonding wire may have approximately a smaller diameter than the second bonding wire.

According to another exemplary embodiment of the present invention, there is provided a method of wire bonding including providing a carrier having at least a first pad, placing a first semiconductor chip to the carrier, the first semiconductor chip having at least a second pad, placing a second semiconductor chip to the carrier, the second semiconductor chip having at least a third pad that may be approximately smaller than the first pad, such that a distance between the first pad and the third pad may be approximately greater than a distance between the first pad and the second pad, forming a conductive first stud bump on the third pad, forming a first bonding wire that electrically connects the second pad and the first pad, and forming a second bonding wire, one end which may be electrically connected to the first pad by a prominence and the other end electrically connected to the third pad by extending from the prominence onto the stud bump, wherein the second bonding wire may be bonded to the stud bump by stitch bonding, the prominence may be bonded to the first pad by ball bonding and may have an approximately larger diameter than the first stud bump, the second binding wire may have an approximately larger length than the first bonding wire.

According to another exemplary embodiment of the present invention, there is provided a wire bond device including having at least a first pad, a semiconductor chip having at least a second pad, the second pad being approximately smaller than the first pad, a conductive stud bump formed on the second pad, a bonding wire, one end which may be electrically connected to the first pad by a prominence, and the other end electrically connected to the second pad by extending from the prominence onto the stud bump, the bonding wire may be bonded to the stud bump by stitch bonding, wherein the prominence may be bonded to the first pad by ball bonding and may have an approximately larger diameter than the stud bump.

According to other exemplary embodiments of the present invention, the prominence may be bonded to the first pad by ball bonding, the prominence may have an approximately larger diameter than the stud bump.

According to other exemplary embodiments of the present invention, the bonding wire is bonded to the stud bump by stitch bonding.

According to other exemplary embodiments of the present invention, the stud bump may be bonded to the second pad by a ball bonding method which uses a wire that may have approximately a smaller diameter than the bonding wire.

According to other exemplary embodiments of the present invention, the stud bump may have approximately a smaller diameter than the prominence bonded to the first pad.

In accordance to an exemplary embodiment of the present invention, after a small pitch bump is formed on a chip pad of a semiconductor substrate, a wire may be bonded to the small pitch bump using reverse bonding. As a result, dependence of the diameter of the bonding wire upon the size of the chip pad may be overcome. Even if the size of the chip pad may be small, a wire bonding process can be performed using a wire having a larger diameter which may be appropriate for the small pitch chip pad. Thus, the bonding wire cannot be bent or swept.

Exemplary embodiments of the present invention provide a method and apparatus for increasing the diameter of a wire required for wire bonding without being limited by the size of a conductive pad for a semiconductor chip.

BRIEF DESCRIPTION OF THE DRAWINGS

Exemplary embodiments of the present invention will be readily understood with reference to the following detailed description thereof provided in conjunction with the attached drawings in which.

DETAILED DESCRIPTION OF THE INVENTION

Exemplary embodiments of the present invention will now be described more fully with reference to the accompanying drawings, in which exemplary embodiments of the invention are shown.

In at least one exemplary embodiment of the present invention, a small pitch bump may be formed on a pad of a semiconductor chip, and a wire is reversely bonded to the fine pitch bump by a stitch bonding method. With the high integration of semiconductor devices and downscaling of design rules, a wire of sufficient diameter can be used for wire bonding without being limited by the size of the chip pad, even if the size of the chip pad is fine. As a result, when a wire with a small diameter is used, the wire will not bend or be prone to sweeping.

Figure 5:
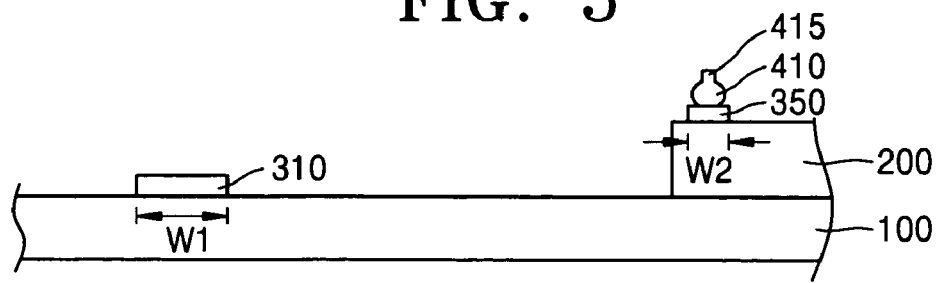
FIGS. 5 and 6 are cross-sectional views illustrating a method of bonding a wire to a fine pitch bump using reverse bonding according to at least one exemplary embodiment of the present invention.
Figure 6:
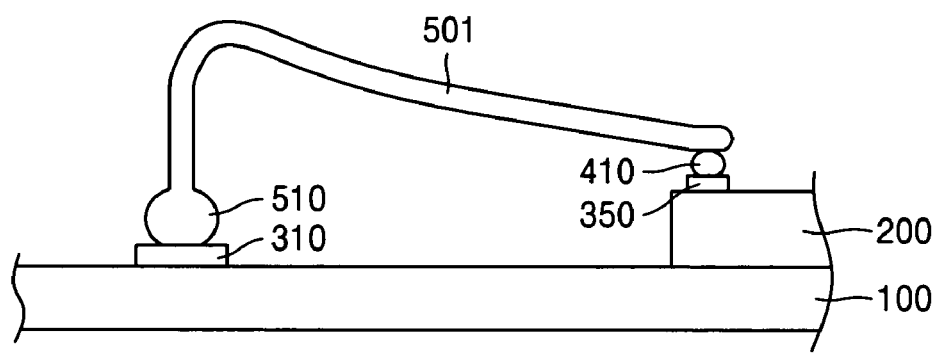

FIGS. 5 and 6 illustrate a method of bonding a wire on a fine pitch bump using reverse bonding according to at least one exemplary embodiment of the present invention.

Referring to FIGS. 5 and 6, a reverse wire bonding method may be performed according to at least one exemplary embodiment of the present invention. Particularly, a prominence 510 can be formed on a first pad 310, which has a relatively great width W1 so as to bond a wire to the first pad 310 by a ball bonding method. The prominence 510 can be in a ball-like shape. However, it should be appreciated that the prominence 510 can be in other shapes. The first pad 310 may be, for example, but not limited to, a conductive electrode pad, such as a lead, which can be formed on a carrier 100. Thereafter, a wire 501 which extends from the prominence 510 can be bonded by using a reverse bonding method to a second pad 350. In other words, the extending wire 501 can be bonded by a stitch bonding method to a conductive bump 410 that can be formed beforehand on the second pad 350. The second pad 350 has relatively a small width W2, and can be generally formed on a semiconductor chip 200.

The first pad 310 may be formed to a relatively greater width given the structure of a semiconductor chip package in comparison to the width of the second pad 350. As a result, the second pad 350 formed on the semiconductor chip for wire bonding can be formed with a very small pitch as the semiconductor chip 200 is scaled down and the integration density of the semiconductor chip 200 increases. As an exemplary embodiment, the second pad 350 is formed to a width of W2 that can be approximately smaller than the width W1 of the first pad 310.

In an exemplary embodiment, the width of a bonded portion may be larger in comparison with the width of the second pad 350. In other words, when the wire 501 having a diameter appropriate for the width W1 of the first pad 310 can be directly bonded to the first pad 310, the diameter of the wire cannot be appropriate for the width W2 of the second pad 350. Accordingly, to solve this problem, a conventional wire bonding method employs a wire that has a diameter appropriate for the width of the second pad 350, i.e., a wire with a relatively smaller diameter.

Figure 7A:
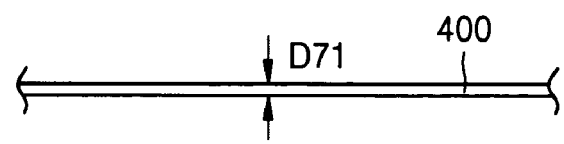
FIGS. 7A and 7B are cross-sectional views of wires having different diameters according to at least one exemplary embodiment used in the method of FIGS. 5 and 6.
Figure 7B:
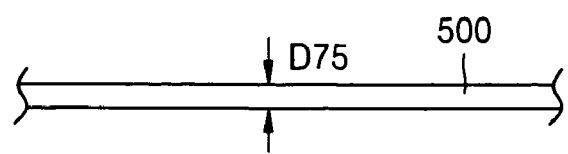

FIGS. 7A and 7B are cross-sectional views of wires having different diameters according to at least one exemplary embodiment used in the method of FIGS. 5 and 6.

FIGS. 7A and 7B illustrate a first wire 400 and a second wire 500, respectively, having different diameters. As an exemplary embodiment, the first wire 400 has a diameter D71 appropriate for the width W2 of the second pad 350, and the second wire 500 has a diameter D75 appropriate for the width W1 of the first pad 310. Thus, taking into account the diameter size of the first and second wires 400 and 500, it is substantially impossible to use the second wire 500 as a bonding wire since the diameter D75 of the second wire 500 is limited by the width W1 of the second pad 350, which is less than the width W2 of the first pad 310. If the second wire 500 can be used as a bonding wire, the portion where the second wire 500 is bonded to the second pad 350, then the second wire 500 will be out of range in comparison to the width of the second pad 350. This results in problems, such as short circuiting between adjacent second pads 350.

Accordingly, in accordance with at least one exemplary embodiment, wire bonding can be performed using the first wire 400 with a diameter D71 which can be appropriate for width W2 of the second pad 350, and the second wire 500 with a diameter D74, as illustrated in FIGS. 7A and 7B.

In order to use the second wire 500 having the diameter D75 which is out of range in comparison to the width W2 of the second pad 350, a stud bump 410 having the appropriate width for the width W2 of the second pad 350 can be formed on the second pad 350. In an exemplary embodiment, the stud bump 410 can be formed within the width range of the second pad 350. Thus, the width or pitch of the stud bump 410 may be approximately less than the width W2 of the second pad 350.

It should be appreciated that the stud bump 410 may be formed using various known methods for forming a conductive bump, which is required for a package manufacturing process. Particularly, as shown in the exemplary embodiment of FIG. 8A, a prominence is formed by providing a relatively thin wire to a terminal portion of a first capillary 610 of a wire bonding machine, and the prominence is bonded to the second pad 350 by a ball bonding method. It should be further understood that the prominence can be in a ball-like shape.

In the exemplary embodiment, the thin wire may be the first wire 400 having the diameter D71 appropriate for the width W2 of the second pad 350, as shown in FIG. 7A. Thereafter, the stud bump 410 is cut off from the wire 400 using the first capillary 610, and then the first capillary 610 moves over the second pad 350, thereby completing the stud bump 410. By this process, a small pitch stud bump may be formed.

In accordance to another exemplary embodiment, as shown in FIG. 5, the completed stud bump 410 may include a prominence 415 having a small diameter. The prominence 415 prevents a portion where the wire 501 may be bonded to the stud bump 410 from being formed to a undesirably wide width when the wire 501 may be bonded to the stud bump 410 by a stitch bonding method as shown in FIG. 6. In other words, as the prominence 415 having the approximately small diameter is pressed against the wire 501 and firstly stitch-bonded, the bonded portion between the wire 501 and the stud bump 410 does not extend but may be limited to a relatively smaller range.

Figure 8A:
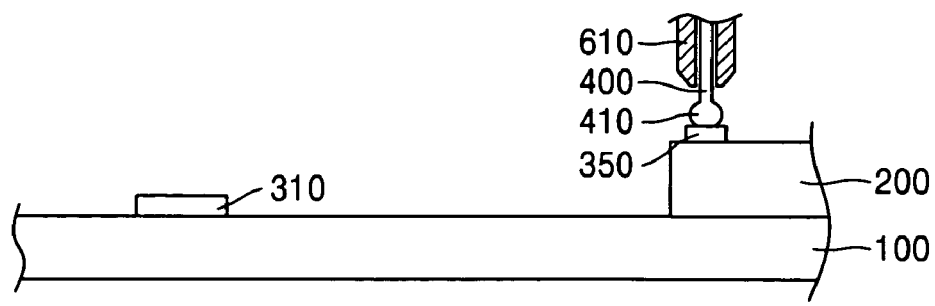
FIGS. 8A through 8C are cross-sectional views illustrating a method of bonding a wire to a fine pitch bump according to at least one exemplary embodiment by using wires having different diameters of FIGS. 7A and 7B.
Figure 8B:
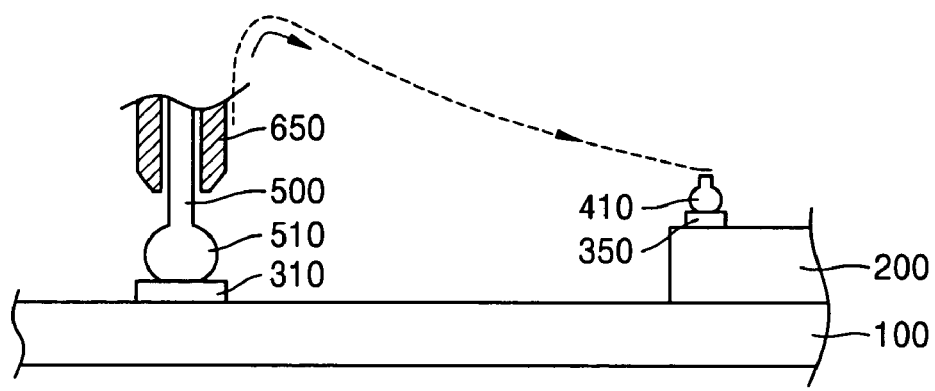

As similarly illustrated in FIG. 8B, a prominence 510 may be formed at a terminal portion of a second capillary 650 by providing a wire with an approximately larger diameter then the second capillary 650, and the prominence 510 may be bonded to the first pad 310 by by a ball bonding method. Thus, the wire having the approximately larger diameter may be the second wire 500 with a diameter D75 which may be appropriate for width W1 of the first pad 310 as shown in FIG. 7B.

It should be appreciated that the ball-shaped prominence 510 formed on the first pad 310 may be formed using the second wire 500 with an approximately larger diameter D75 than the first wire 400 which may be used to form the stud bump 410. Therefore, the prominence 510 has an approximately larger diameter or width than the stud bump 410.

Thereafter, the wire 501 continues to extend from the prominence 510 using the second capillary 650, and the second capillary 650 moves over the stud bump 410. Next, the wire 501 that extends from the prominence 510 disposed on the first pad 310 may be bonded to the stud bump 410 by a stitch bonding method, and the second wire 500 can be cut off. Thus, the bonding wire 501 may be completed.

As a result, the wire bond structure may employ a wire which may be appropriate for a smaller width W2 of the second pad 350, for example, the second wire 500 of FIG. 7B has an approximately greater diameter than the first wire 400 of FIG. 7A. Thus, the resultant bonding wire 501 may be formed using a wire with a sufficient diameter, which may not be limited by the size of the second pad 350.

Therefore, even if the bonding wire 501 may extend to a relatively greater length or the second pad 350 may be formed to a relatively small size, the bonding wire 501 may be formed using a wire having a relatively greater diameter. As compared with the conventional method in which a relatively thin wire should be used, the drawbacks of bending or sweeping of the bonding wire 501 may be reduced or prevented.

Figure 8C:
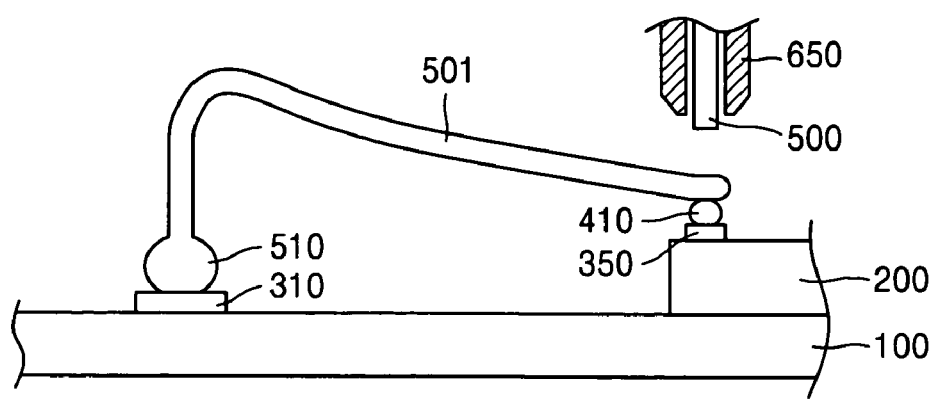

In accordance with another exemplary embodiment, although FIGS. 6 and 8C exemplarily illustrate a case where only one stud bump 410 may be bonded to the bonding wire 501, in some cases, a second stud bump (not shown) may be stacked on the stud bump 410 such that the bonding wire 601 can be bonded to the second stud bump by a stitch bonding method. In addition, in accordance with the exemplary embodiment of the present invention, the first pad 310 is described as an electrode pad that may be electrically connected to, such as, but not limited to a lead or the like disposed on the carrier 100. It should be appreciated that the first pad 310 may be another conductive pad disposed on a second semiconductor chip (not shown) that may be other than the semiconductor chip 200.

In accordance with another exemplary embodimentby referencing FIGS. 5 through 8C, the stud bump 410 may be formed when after the semiconductor chip 200 is attached to the carrier 100, on which a lead and the first pad 310 that is electrically connected to the lead are formed for the wire bonding process. In other words, after the semiconductor chip 200 that is separated from a wafer, for exampleby sawing is attached to the carrier 100 by using a die attaching process, the stud bump 410 may be formed on the second pad 350 of the semiconductor chip 200.

In accordance with at least one of the exemplary embodiments, a process of forming the stud bump 410 and a process of forming the bonding wire 501 (i.e., a reverse wire bonding process) may be performed in the same ball bonding machine by alternately providing wires 400 or 500 having different diameters to the capillary 610. Alternatively, the process may be performed in different ball bonding machines.

In an exemplary embodiment, the first wire 400 may have a diameter of approximately 25.4 μm or less, and the second wire 500 may have a diameter of approximately 30 μm or more. The open size (i.e., width) of the second pad 350 formed on the semiconductor chip 200 may be about approximately 70 μm or less. As the width of the second pad 350 decreases, the diameter of the first wire 400 may also decrease. In accordance with at least one exemplary embodiment of the present invention, the length of the bonding wire 501 between the first pad 310 and the second pad 350 may be approximately 1.5 mm or more.

In accordance with another exemplary embodiment, the stud bump 410 may be formed on the second pad 350 before the semiconductor chip 200 is attached to the carrier 100, (i.e., before the die-attaching process), as described in FIGS. 5 and 8A.

Figure 9A:
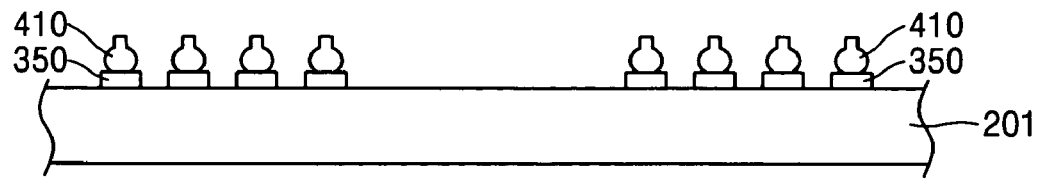
FIGS. 9A through 9C are cross-sectional views illustrating a method of forming a stud bump according to another exemplary embodiment of the present invention.
Figure 9B:
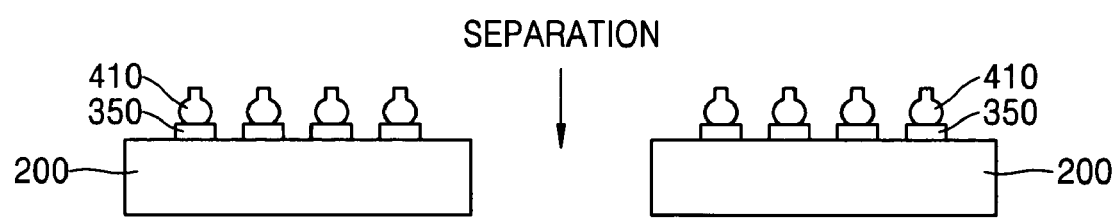
Figure 9C:
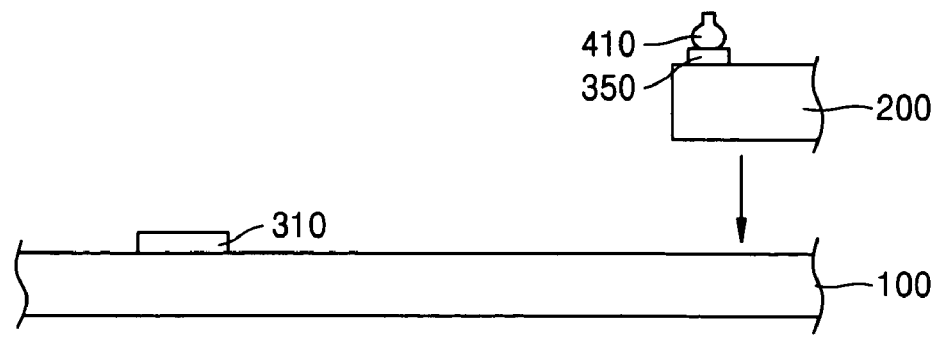

FIGS. 9A 9C illustrate a method of forming a stud bump according to at least one exemplary embodiment of the present invention.

Referring to FIG. 9A, a stud bump 410 may be formed on a conductive second pad 350, which may be formed on the wafer 201 for bonding before a semiconductor chip may be separated from a wafer 201, (i.e., before a sawing process may be performed). If the size of the second pad 350 is small, as described with reference to FIGS. 5 and 8A, a stud bump 410 may be formed using a wire having a diameter appropriate for the size of the second pad 350, for example, a diameter of approximately 25.4 μm or less.

In accordance with another exemplary embodiment, referring to FIG. 9B, the wafer 201 may be sawed and separated into individual semiconductor chips 200.

In accordance with another exemplary embodiment, referring to FIG. 9C, a semiconductor chip 200 may be attached using a die attaching process to the carrier 100 on which the first pad 310 may be attached as an electrode pad that may be electrically connected to a lead. Thereafter, a bonding wire 501 may be formed as described with reference to FIGS. 6, 8B, and 8C.

The above-described reverse wire bonding method may be applied when a bonding wire forms a long loop on a semiconductor chip on which a small pitch pad may be formed.

Figure 10A:
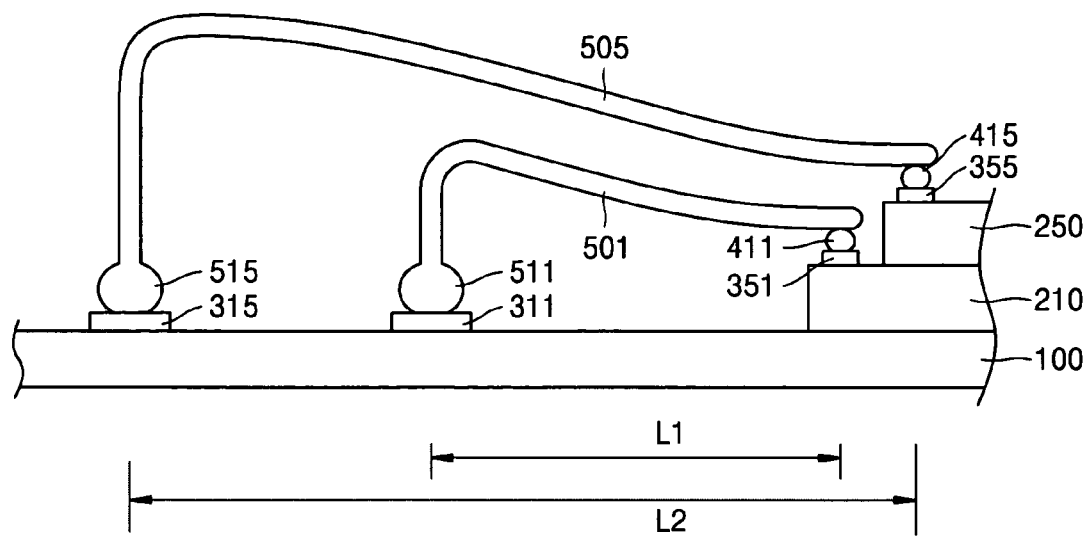
FIGS. 10A and 10B are cross-sectional views of wire bond structures that are formed according to at least one exemplary embodiment of the present invention.
Figure 10B:
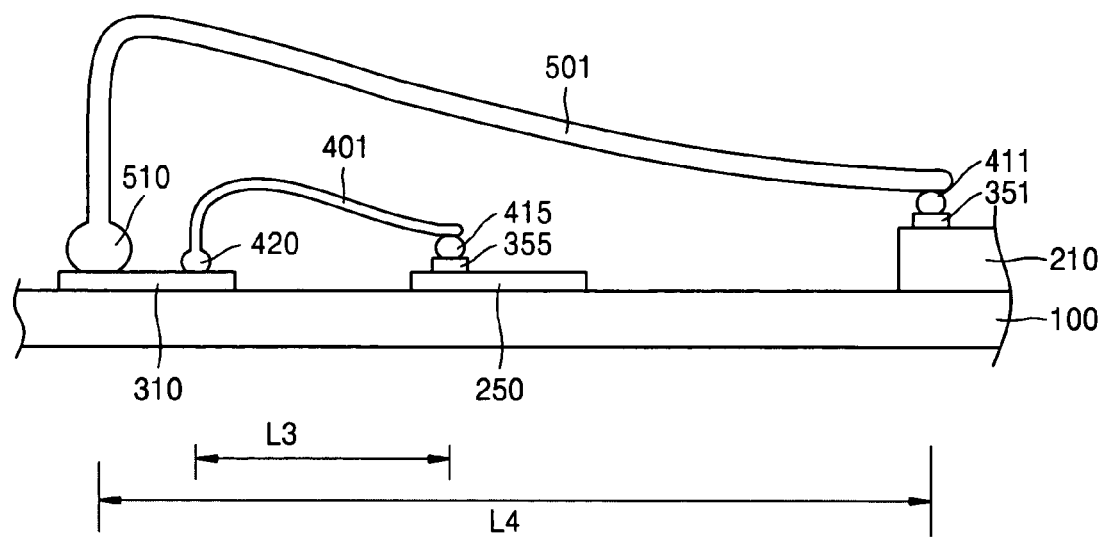

FIGS. 10A and 10B are cross-sectional views of examples of wire bond structures that may be formed by the method of at least one exemplary embodiment of the present invention.

Referring to FIG. 10A, to form an MCP, semiconductor chips 210 and 250 may be stacked and attached to a carrier 100 on which a first pad 311 and a second pad 315, may be formed. It should be appreciated that the first pad 311 and the second pad 315 may each have a relatively great size.

A relatively small third pad 351, which may be formed on the first semiconductor chip 210 that may be located under the second semiconductor chip 250, may be electrically connected to the first pad 311. The first pad 311 may be disposed at a relatively small distance L1 apart from the third pad 351. Also, a relatively small fourth pad 355, which may be formed on the second semiconductor chip 250 that may be located on the first semiconductor chip 210, may be electrically connected to the second pad 315. The second pad 315 may be disposed at a relatively greater distance L2 apart from the fourth pad 355.

A first bonding wire 501, which may electrically connect the first pad 311 and the second pad 351 may be formed of a relatively small bonding wire which may be appropriate for the third pad 351. The first pad 311 and the second pad 351 may be spaced a distance L1 apart from each other. Thus, after a first stud bump 411 may be formed on the third pad 351 as described with reference to FIGS. 5 and 8A, a prominence 511 may be formed and attached to the first pad 311. The first bonding wire 501 may extend from the prominence 511 to the first stud bump 411, and the first stud bump 411 may be bonded to the first bonding wire 501 by a stitch bonding method.

Meanwhile, a second bonding wire 505, which may electrically connect the second pad 315 and the fourth pad 355 forms a long loop. The second pad 315 and the fourth pad 355 are spaced a distance L2 apart from each other. For example, the second bonding wire 505 may have a length of approximately 1.5 mm or more. In the exemplary embodiment, if the open size of the fourth pad 355 is approximately 70 μm or less, then the second bonding wire 505 appropriate for this fourth pad 355 may have a small diameter of approximately 25.4 μm or less.

However, as discussed in the conventional art, if a thin wire, such as the second bonding wire 505, is used, the wire may be bent or swept. To prevent theproblem, as described above with reference to FIGS. 5 and 8A, a small pitch second stud bump 415 may be formed as a precaution on the small fourth pad 355. Thereafter, as described with reference to FIGS. 6 and 8C, a prominence 515 may be attached to the second pad 315, and the second bonding wire 505 may extend from the prominence 515 to the second stud bump 415. The prominence 515 may be in ball-like shape. Thereafter, the second bonding wire 505 may be bonded to the second stud bump 415 by a stitch bonding method.

In this case, since the relatively thick wire, which is inappropriate for the small third pad 351 or fourth pad 355, may be used for wire bonding. As a result, the wire maynot be bent or swept.

Referring to FIG. 10B, a plurality of semiconductor chips 210, 250 may be attached in a predetermined arrangement to the carrier 100 on which the relatively great first pad 310 may be formed, and packaged. The semiconductor chips 210, 250 may be used to perform the same function or various functions.

The second pad 351, which has a relatively small size and may be formed on the first semiconductor chip 210, may be electrically connected to the first pad 310. The first pad 310 may be disposed at a relatively greater distance L4 apart from the second pad 351. Also, the third pad 355, which has a relatively small size and may be formed on the second semiconductor chip 250, may be electrically connected to the first pad 310. The first pad 310 may be disposed at a relatively small distance L3 apart from the third pad 355.

Figure 1:
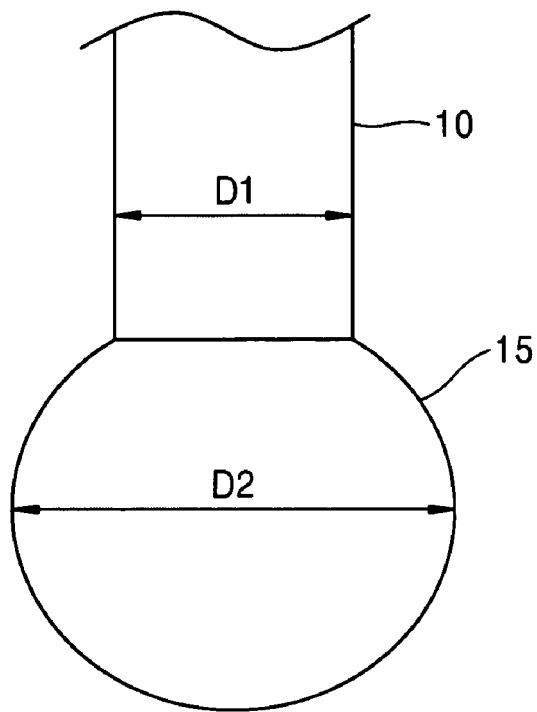
FIGS. 1 through 4 are cross-sectional views illustrating a conventional method of bonding a wire to a chip pad.
Figure 2:
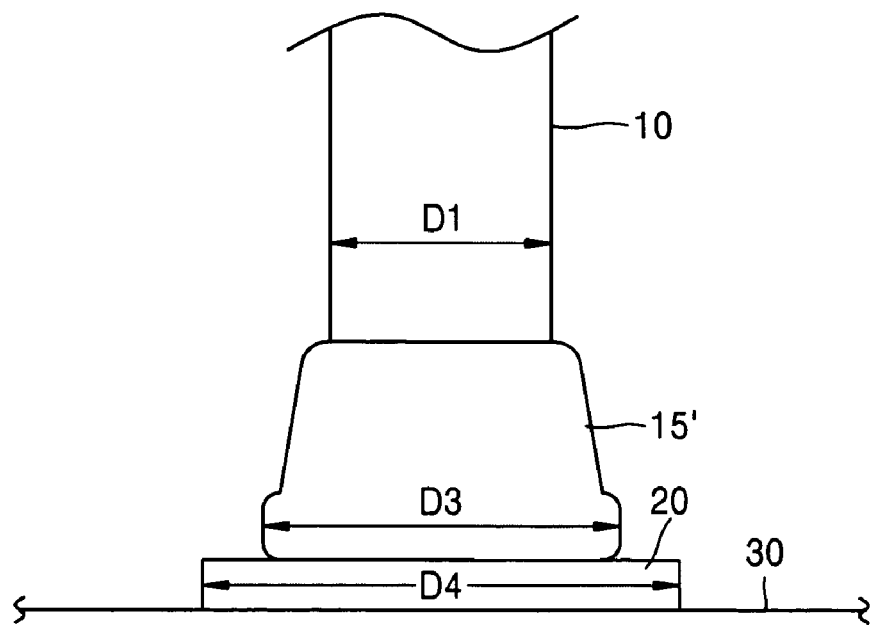
Figure 3:
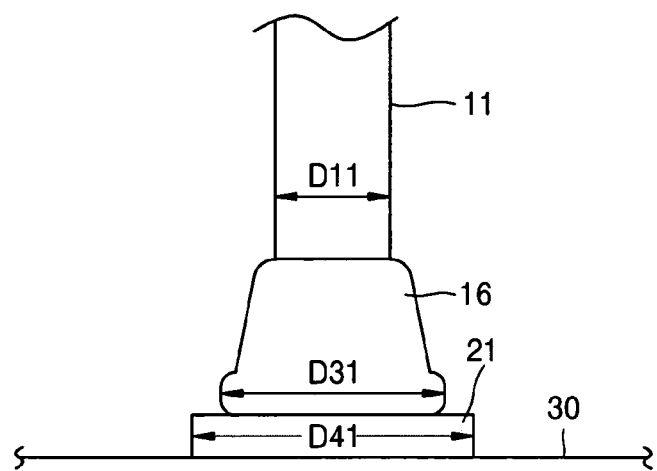
Figure 4:
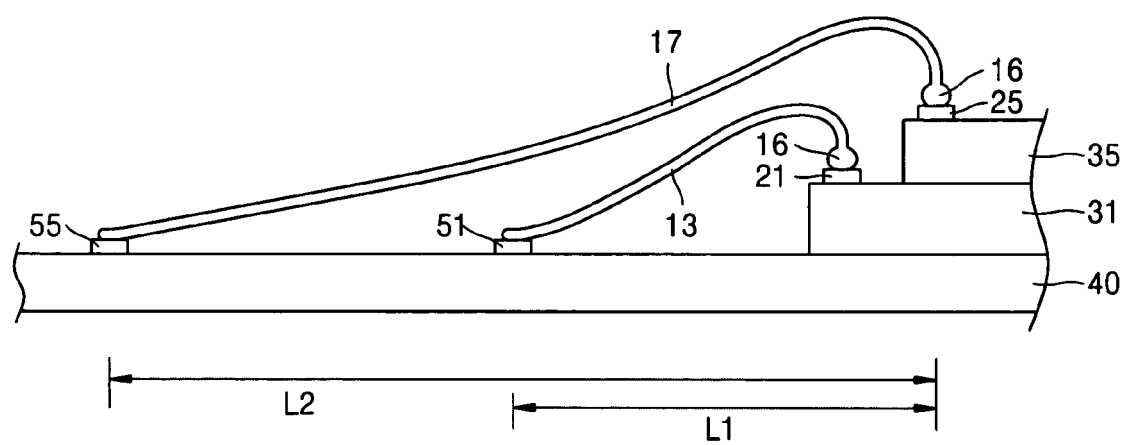

The second bonding wire 401, which may electrically connect the first pad and the third pad 355 (e.g., spaced apart distance L3 from each other) may be formed of a thin bonding wire appropriate for the third pad 355 which has a relatively small size. For example, the small pitch 415 may be formed on the third pad 355 as described with reference to FIGS. 5 and 8A. Thereafter, the prominence 420 may be formed and attached to the first pad 310. The second bonding wire 401 extends from the prominence 420 to the second stud bump 415, and the second stud bump 415 may be bonded to the second bonding wire 401 by a stitch bonding method. Nevertheless, as described above with reference to FIG. 1A, the second bonding wire 401 may be formed of a relatively thick bonding wire.

Tthe first bonding wire 501, which may electrically connect the first pad 310 and the second pad 351 forms a long loop. The first pad 310 and the second pad 351 may be spaced a distance L2 apart from each other. In an exemplary embodiment, the first bonding wire 501 may have a length of approximately 1.5 mm or more. If the open size of the second pad 351 may be approximately 70 μm or less, then the bonding wire appropriate for this second pad 351 may have a relatively small diameter of approximately 25.4 μm or less.

In accordance with at least one exemplary embodiment, the small pitch first stud bump 411 may be firstly formed on the second pad 351 as described above with reference to FIGS. 5 and 8A. Thereafter, as described with reference to FIGS. 6 and 8C, a prominence 510 having a greater diameter may be attached to the first pad 310. The prominence 510 may be in ball-like shape. The first bonding wire 501 having a relatively great diameter may extend from the prominence 510 to the first stud bump 411. Then, the first bonding wire 501 may be bonded to the first stud bump 411 by a stitch bonding method.

Thus, the relatively thick wire, which may be inappropriate for the small second pad 351, may be used for wire bonding.

As explained thus far, dependence of the diameter of a bonding wire upon the size of a chip pad may be overcome. Thus, even if the size of the chip pad may be small, a wire bonding process may be performed using a wire with a greater diameter than appropriate for the small pitch chip pad. As a result, the bonding wire maynot be bent or swept.

As described in the above exemplary embodiments, the term "prominence" in the present invention may refer to a ball-shaped portion formed at a terminal end of a wire. However, it should be appreciated that prominence may relate to other design of projections, protuberances, or tails that extends (bulge out) from the wire.

While the present invention has been particularly shown and described with reference to exemplary embodiments thereof, it should be understood by those of ordinary skill in the art that various changes in form and details may be made therein without departing from the spirit and scope of the invention as defined by the following claims.

What is claimed is:

1. A method of wire bonding, comprising:
providing a carrier with at least a first pad and a semiconductor chip arranged on the carrier with at least a second pad, the second pad being smaller than the first pad;
forming a conductive first stud bump on the second pad; and
forming a first bonding wire that has two terminal portions, which are respectively bonded to the first pad and the first stud bump to electrically connect the first pad and the second pad,
wherein one end of the terminal portion includes a first prominence formed by ball bonding and the first prominence has a larger diameter than the first stud bump,
the first stud bump is bonded to the second pad by ball bonding using a wire that has a smaller diameter than the first bonding wire, and
the forming of the first stud bump and the forming of the first bonding wire connected to the first pad are performed by an identical wire bonding machine by alternately providing wires having different diameters to a capillary.

2. The method according to claim 1, wherein the other end of the terminal portion is electrically connected to the second pad by extending from the first prominence onto the first stud bump, and the first bonding wire is bonded to the first stud bump by stitch bonding.

3. The method of claim 1, wherein the wire that has the smaller diameter than the first bonding wire has a diameter that allows the first stud bump to be approximately within the size range of the second pad.

4. The method of claim 2, wherein the second pad has a size of approximately 70 μm or less, the wire that has the smaller diameter than the first bonding wire has a diameter of approximately 25.4 μm or less, and the first bonding wire that is electrically connected to the first pad has a diameter of approximately 30 μm or more.

5. The method of claim 2, further comprising:
providing a wafer;
separating the wafer into individual semiconductor chips, each of the semiconductor chips includes the at least second pad; and
bonding the semiconductor chips to the carrier.

6. The method of claim 5, wherein the wire that has the smaller diameter than the first bonding wire has a diameter that allows the first stud bump to be within approximately the size range of the second pad.

7. The method of claim 2, further comprising:
providing a wafer having at least a second pad, the second pad being smaller than the first pad; and
separating the wafer into individual semiconductor chips.

8. The method of claim 2, wherein the wire having the smaller diameter than the first bonding wire has a diameter that allows the first stud bump to be within approximately the size range of the second pad.

9. The method of claim 2, further comprising:
placing a second semiconductor chip on the first semiconductor chip, the second semiconductor chip including a third pad that has a smaller size than the first pad;
forming a conductive second stud bump on the third pad; and
forming a second bonding wire, one end of which is electrically connected to a fourth pad by a second prominence and the other end electrically connected to the third pad by extending from the second prominence onto the second stud bump, wherein the second bonding wire is bonded to the second stud bump by stitch bonding.

10. The method of claim 9, wherein before forming the first bonding wire, further comprising forming the conductive second stud bump on the second pad, the second stud bump having approximately the same size as the first stud bump.

11. The method of claim 10, wherein the first bonding wire is electrically connected to the first pad by the first prominence at one end and, electrically connected to the second pad by extending from the first prominence to the second stud bump at the other end.

12. The method of claim 10, wherein the first bonding wire is bonded to the second stud bump by stitch bonding.

13. The method of claim 10, wherein the first bonding wire has approximately the same diameter as the second bonding wire.

14. The method of claim 10, wherein the first bonding wire has approximately a smaller diameter than the second bonding wire.

15. The method of claim 2, further comprising:
providing a wafer having at least a second pad, the second pad being smaller than the first pad;
placing a first semiconductor chip on the carrier, the first semiconductor chip having at least the second pad;
placing a second semiconductor chip on the carrier, the second semiconductor chip having at least a third pad that is smaller than a fourth pad, such that a distance between the fourth pad and the third pad is greater than a distance between the first pad and the second pad;
forming a conductive second stud bump on the third pad; and
forming a second bonding wire, one end of which is electrically connected to the fourth pad by a second prominence and the other end electrically connected to the third pad by extending from the second prominence onto the second stud bump, wherein the second bonding wire is bonded to the second stud bump by stitch bonding, the second prominence is bonded to the fourth pad by ball bonding, and the second bonding wire has a larger length than the first bonding wire.

16. The method of claim 15, wherein the first stud bump is bonded to the second pad by ball bonding using a wire that has approximately a smaller diameter than the second bonding wire.

17. The method of claim 15, wherein before forming the first bonding wire, further comprising forming the conductive second stud bump on the third pad, the second stud bump having approximately the same size as the first stud bump.

18. The method of claim 17, wherein the first bonding wire is electrically connected to the first pad by the first prominence at one end, and electrically connected to the second pad by extending from the first prominence to the second stud bump at the other end.

19. The method of claim 18, wherein the first bonding wire is bonded to the second stud bump by stitch bonding.

20. The method of claim 18, wherein the first bonding wire has approximately the same diameter as the second bonding wire.

21. The method of claim 18, wherein the first bonding wire has approximately a smaller diameter than the second bonding wire.

22. A wire bonding device whose bonded wire is manufactured according to claim 1.

* * * * *